United States Patent
Kanawati et al.

(10) Patent No.: US 10,530,357 B1
(45) Date of Patent: Jan. 7, 2020

(54) DYNAMIC IMPEDANCE CIRCUIT FOR UNIFORM VOLTAGE DISTRIBUTION IN A HIGH POWER SWITCH BRANCH

(71) Applicant: Newport Fab, LLC, Newport Beach, CA (US)

(72) Inventors: Roda Kanawati, Irvine, CA (US); Paul D. Hurwitz, Irvine, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 16/188,131

(22) Filed: Nov. 12, 2018

(51) Int. Cl.
| | |
|---|---|
| *H03K 17/687* | (2006.01) |
| *H03K 17/16* | (2006.01) |
| *H03K 17/10* | (2006.01) |
| *H03H 11/28* | (2006.01) |
| *H01L 27/06* | (2006.01) |
| *H01L 29/08* | (2006.01) |
| *H01L 23/535* | (2006.01) |
| *H01L 29/423* | (2006.01) |

(52) U.S. Cl.
CPC ......... *H03K 17/102* (2013.01); *H01L 23/535* (2013.01); *H01L 27/0629* (2013.01); *H01L 29/0847* (2013.01); *H01L 29/4238* (2013.01); *H03H 11/28* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,008,988 | B1* | 8/2011 | Yang | H03K 17/693 333/101 |
| 9,124,265 | B2* | 9/2015 | Dykstra | H03K 17/005 |
| 9,190,994 | B2* | 11/2015 | Hurwitz | H03K 17/161 |
| 9,438,223 | B2* | 9/2016 | de Jongh | H03K 17/161 |
| 9,876,496 | B2* | 1/2018 | Yoo | H03K 17/693 |
| 10,050,609 | B2* | 8/2018 | Yoo | H01P 1/213 |

* cited by examiner

*Primary Examiner* — An T Luu
(74) *Attorney, Agent, or Firm* — Bever, Hoffman & Harms, LLP

(57) ABSTRACT

A high power semiconductor switch including a plurality of transistor switch circuits connected in series between first and second ports. A first set of transistor switch circuits is located immediately adjacent to the first port, a second set of transistor switch circuits is located immediately adjacent to the second port, and a third set of transistor switch structures are located between the first and second sets. Each transistor switch circuit of the first and second set includes a switching transistor and a dynamic impedance circuit, wherein the dynamic impedance circuit reduces the effective impedance of the corresponding switching transistor when an RF signal is being transmitted. The dynamic impedance circuits are designed to reduce and equalize the voltage drops across the switching transistors of the first and second sets.

19 Claims, 8 Drawing Sheets

US 10,530,357 B1

DYNAMIC IMPEDANCE CIRCUIT FOR UNIFORM VOLTAGE DISTRIBUTION IN A HIGH POWER SWITCH BRANCH

FIELD OF THE INVENTION

The present invention relates to dynamic impedance circuitry that improves voltage distribution across a stack of transistors in a high power switch, thereby allowing for high power designs that exhibit a minimum area/performance penalty.

RELATED ART

FIG. 1 is a circuit diagram of a conventional uniform stack 100 of a plurality of series-connected transistor circuits $110_1$-$110_N$, which extend between a first port 101 and a second port 102. Conventional uniform stack 100 can be used to implement a radio frequency (RF) switch, wherein the first port 101 is coupled to an antenna and the second port 102 is coupled to an RF receiver circuit (or an RF transmitter circuit). Transistor circuits $110_1$-$110_N$ include identical high-voltage field effect transistors (FETs) $120_1$-$120_N$, respectively, identical gate bias resistors $130_1$-$130_N$, respectively, identical body/channel bias resistors $140_1$-$140_N$, respectively, and identical source/drain resistors $150_1$-$150_N$, respectively. Gate bias control circuitry (not shown) applies control voltages to the gates of high-voltage FETs $120_1$-$120_N$ through gate bias resistors $130_1$-$130_N$, respectively. Body bias control circuitry (not shown) applies control voltages to the body regions of high-voltage FETs $120_1$-$120_N$ through body bias resistors $140_1$-$140_N$, respectively. Source/drain resistors $150_1$-$150_N$ are connected in parallel with high-voltage transistors $120_1$-$120_N$, respectively.

Transistors $120_1$-$120_N$ are connected in series between the first port 101 and the second port 102. These transistors $120_1$-$120_N$ are controlled to route (or prevent the routing of) RF signals between the first port 101 and the second port 102. As used herein, an RF signal is defined as a signal having a frequency in the range of about 10 kHz to 50 GHz. The on-resistance of the RF switch ($R_{ON}$) multiplied by the off-capacitance of the RF switch ($C_{OFF}$) is a key figure of merit, which dictates the ability to transmit RF power with low losses through the on-state uniform transistor stack 100, while maintaining adequate isolation across the off-state uniform transistor stack 100. Thin film SOI CMOS transistors are attractive for RF switch applications, because these transistors reduce the junction capacitance component of the off-capacitance value, $C_{OFF}$. Transistors $120_1$-$120_N$ are therefore typically implemented using thin film SOI CMOS transistors.

FIG. 2 is a schematic diagram illustrating the general construction of transistor $120_1$, which is formed in an active semiconductor region 10. As illustrated by FIG. 2, transistor $120_1$ includes a plurality of source regions 1 interleaved with a plurality of drain regions 2 within the active region 10. These source and drain regions are separated by channel/body regions 4 that extend under a multi-finger polysilicon gate electrode 3 in a manner known in the art. The source and drain regions 1-2 have a first conductivity type, while the channel/body regions 4 have an opposite conductivity type. The length of each gate finger is shown as dimension Lg in FIG. 2, while the width of each gate finger over the active region is shown as dimension Wf in FIG. 2. The total length of the transistor 1201 is shown as dimension $L_T$ in FIG. 2. The plurality of source regions 1 are commonly connected to the first port 101, and the plurality of drain regions 2 are commonly connected to the adjacent transistor $120_2$ (e.g., by metal interconnect structures). Connections to the corresponding resistors $130_1$, $140_1$ and $150_1$ are shown generally in FIG. 2.

The multi-finger structure of transistor $120_1$ allows this transistor to exhibit a relatively small on-resistance ($R_{ON}$) and a relatively high power handling capability. The width (Wf) of each gate finger can be relatively long (e.g, on the order of about 15 microns), and the number of gate fingers can be relatively high (e.g., in the hundreds), such that the total effective gate width is relatively large (e.g., on the order of 5 mm), resulting in a low on-resistance ($R_{ON}$) of this transistor.

Relatively high voltage RF signals (e.g., 40-70V) are typically applied across the first and second ports 101-102 of the uniform stack while the transistors of the uniform stack 100 are in an off-state. In general, the gate length (Lg) of each of transistors $120_1$-$120_N$ (and the number of transistors N) must be relatively large to provide the required off-state isolation. In one example, the gate length (Lg) is about 0.18 microns or more, and there are about 30 or more transistors $120_1$-$120_N$ in the uniform transistor stack 100 to enable the off-state stack to withstand 70 Volts across ports 101 and 102.

Source/drain resistors $150_1$-$150_N$ help to keep the interior source/drain nodes of transistors $120_1$-$120_N$ at the same potential as the port receiving the RF signal. Without source/drain resistors $150_1$-$150_N$, the interior transistors of uniform stack 100 would not see the full gate-to-source and body-to-source DC biases.

Parasitic capacitances that exist between transistors $120_1$-$120_N$ and the underlying substrate result in a voltage imbalance across the transistors $120_4$-$120_N$ in the stack 100. In practice, the voltage drops across the transistors $120_4$-$120_N$ are non-uniform, with larger voltage drops existing across transistors located near the ports 101-102. For example, when a high power signal is applied to the first port 101, the highest voltage drop will exist across transistor $120_4$. The voltage drops across successive transistors $120_2$-$120_N$ decrease in a non-uniform manner. In a particular example, when a high power signal is applied to the first port 101, a peak voltage drop of about 4.0 Volts may exist across transistor $120_4$, a peak voltage drop of about 3.7 Volts may exist across transistor $120_2$, a peak voltage drop of about 3.5 Volts may exist across transistor $120_3$, and a peak voltage drop of about 3.4 Volts may exist across transistor $120_4$. If the power becomes high enough that the voltage across transistor $120_4$ exceeds the breakdown voltage of this transistor (e.g. 4.2 Volts), then the entire associated RF switch will fail. A similar problem exists when a high power signal is applied to the second port 102, wherein the highest voltage drop will exist across transistor $120_N$.

Moreover, during high power conditions, relatively high second and third harmonic voltages may undesirably exist in the signal transmitted through the conventional uniform stack 100.

It would therefore be desirable to have an improved transistor stack structure that eliminates the above-described deficiencies of conventional uniform transistor stack 100.

SUMMARY

Accordingly, the present invention provides an improved transistor stack that can be used to transmit RF signals between a first port and a second port. The transistor stack includes a plurality of transistor switch circuits connected in series between the first and second ports. A first subset of the plurality of transistor switch circuits are located immediately adjacent to the first port (i.e., the first subset of the plurality of transistor switch circuits are directly connected to the first port).

In accordance with one embodiment, each of the transistor switch circuits in the first subset includes a switching transistor (which is connected in series between the first and second ports), and a dynamic impedance circuit, which is coupled in parallel with the switching transistor. Each of the dynamic impedance circuits is configured to reduce the effective impedance of the corresponding switching transistor when an RF signal received on the first port is transmitted through the switching transistor.

In accordance with one embodiment, each of the dynamic impedance circuits includes: a first diode connected in series with a first resistor to form a first diode/resistor pair, and a second diode connected in series with a second resistor to form a second diode/resistor pair. The first and second diode/resistor pairs are each coupled in parallel with the corresponding switching transistor. The first and second diodes are configured in opposite directions with respect to the associated switching transistor.

The characteristics of the first diode/resistor pairs and the second diode/resistor pairs are selected such that the voltage drops across the corresponding switching transistors are uniform when an RF signal is being transmitted through these switching transistors. In a particular embodiment, the first and second diode/resistor pairs in the transistor switch circuits located nearer to the first port have lower impedances than the first and second diode/resistor pairs in the transistor switch circuits located further from the first port.

In accordance with one embodiment, all of the transistor switch circuits that are not included in the first subset (i.e., the transistor switch circuits coupled between the first subset of transistor switch circuits and the second port) include switching transistors that are coupled in series between the first and second ports, but do not include dynamic impedance circuits.

In accordance with another embodiment, the plurality of transistor switch circuits additionally includes a second subset of the plurality of transistor switch circuits located immediately adjacent to the second port (i.e., the second subset of the transistor switch circuits are directly connected to the second port). In this embodiment, each of the transistor switch circuits in the second subset includes a switching transistor (which is connected in series between the first and second ports), and a dynamic impedance circuit, which is coupled in parallel with the switching transistor. Each of the dynamic impedance circuits is configured to reduce the effective impedance of the corresponding switching transistor when an RF signal received on the second port is transmitted through the switching transistor. In this embodiment, uniform voltage drops are maintained across the switching transistors located at both ends of the transistor stack (i.e., near the first port and near the second port).

The present invention will be more fully understood in view of the following description and drawings.

DETAILED DESCRIPTION

In general, the present invention provides dynamic impedance circuits in parallel with transistors located at one or both the ends of a high-voltage transistor stack. Each dynamic impedance circuit may include a diode connected in series with a resistor. During high power conditions (i.e., when a high voltage signal is applied across the transistor stack), impedances of the dynamic impedance circuits are reduced (by turning on the diodes), thereby limiting voltage drops across the corresponding parallel transistors. This advantageously allows for more uniform voltage distribution across the transistors of the stack and enables the transistor stack to exhibit improved power handling (e.g., handle a higher peak voltage). In addition, voltage harmonics through the transistor stack may be reduced during certain high power conditions. Advantageously, the dynamic impedance circuits only slightly increase the required layout area and off-capacitance when compared with a conventional uniform stack.

Figure 3:
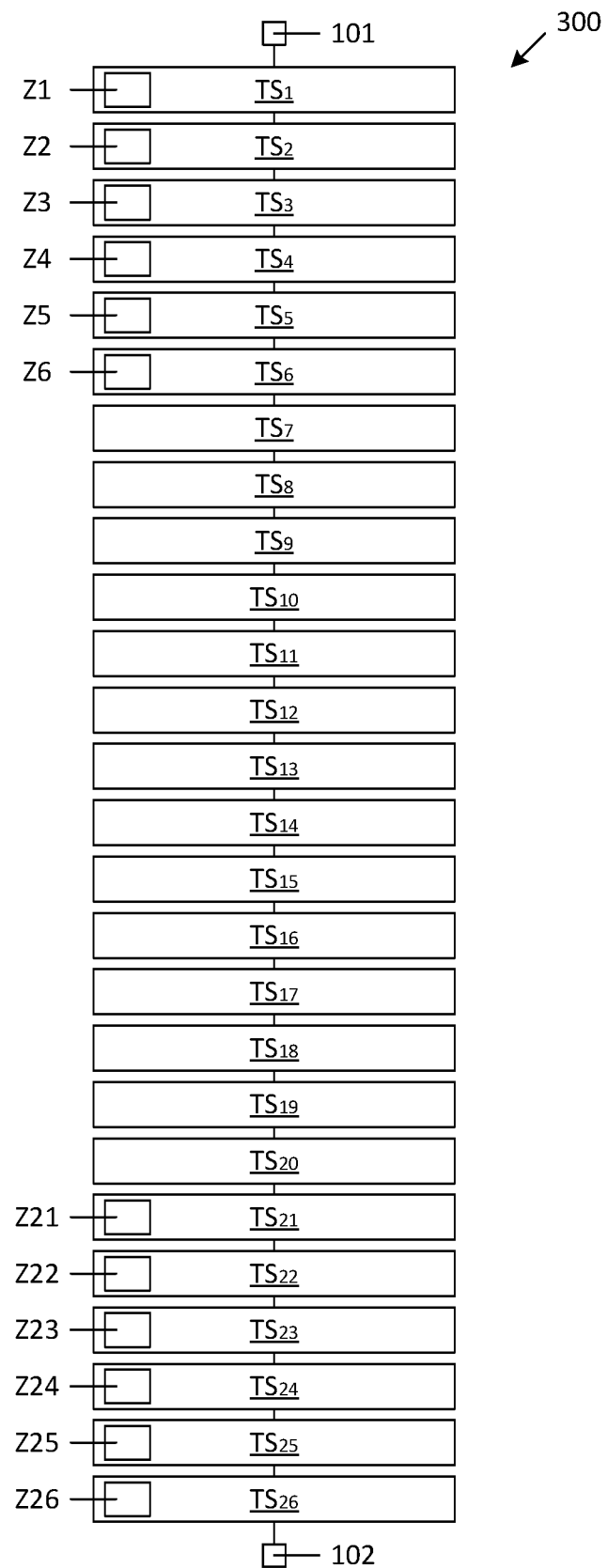
FIG. 3 is a block diagram of a transistor stack that includes dynamic impedance circuits in accordance with one embodiment of the present invention.

FIG. 3 is a block diagram of a transistor stack 300 in accordance with one embodiment of the present invention. Transistor stack 300 includes a plurality of transistor switch circuits $TS_1$-$TS_{26}$, which are connected in series between first port 101 and second port 102. Transistor switch circuits $TS_1$-$TS_{26}$ are controlled to selectively allow (and prevent) the transmission of radio frequency signals between ports 101 and 102. Although the illustrated example includes twenty-six transistor switch circuits $TS_1$-$TS_{26}$, it is understood that other number of transistor switch circuits may be used in other embodiments. The number of transistor switch circuits included in transistor stack 300 is selected in view of the power handling requirements of the particular application. Transistor switch circuits $TS_1$-$TS_6$ and $TS_{21}$-$TS_{26}$, which are located immediately adjacent to ports 101 and 102, respectively, include dynamic impedance circuits $Z_1$-$Z_6$ and $Z_{21}$-$Z_{26}$, respectively. As described in more detail below, the dynamic impedance circuits $Z_1$-$Z_6$ and $Z_{21}$-$Z_{26}$ limit the voltage drops across high voltage transistors included in transistor switch circuits $TS_1$-$TS_6$ and $TS_{21}$-$TS_{26}$. Because the voltage drops that occur away from the ends of the transistor stack 300 are relatively low, the transistor switch circuits located away from the ends of the transistor stack 300 (e.g., transistor switch circuits $TS_7$-$TS_{20}$) do not require dynamic impedance circuits. Not providing dynamic impedance circuits for these transistor switch circuits advantageously minimizes the required active area of the resulting transistor stack 300.

Figure 4A:
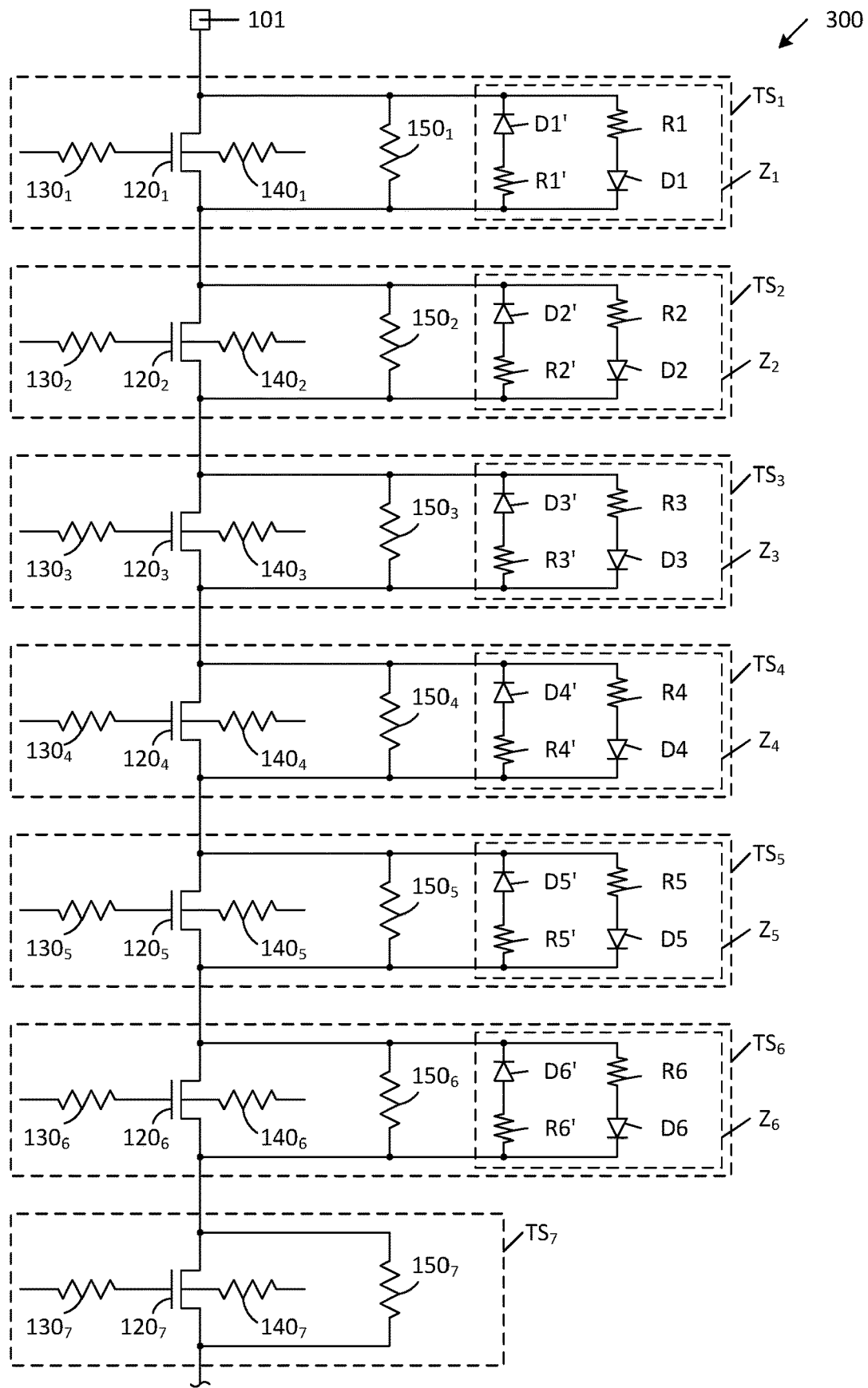
FIGS. 4A and 4B are circuit diagrams illustrating an upper end and a lower end, respectively, of the transistor stack of FIG. 3 in accordance with one embodiment of the present invention.
Figure 4B:
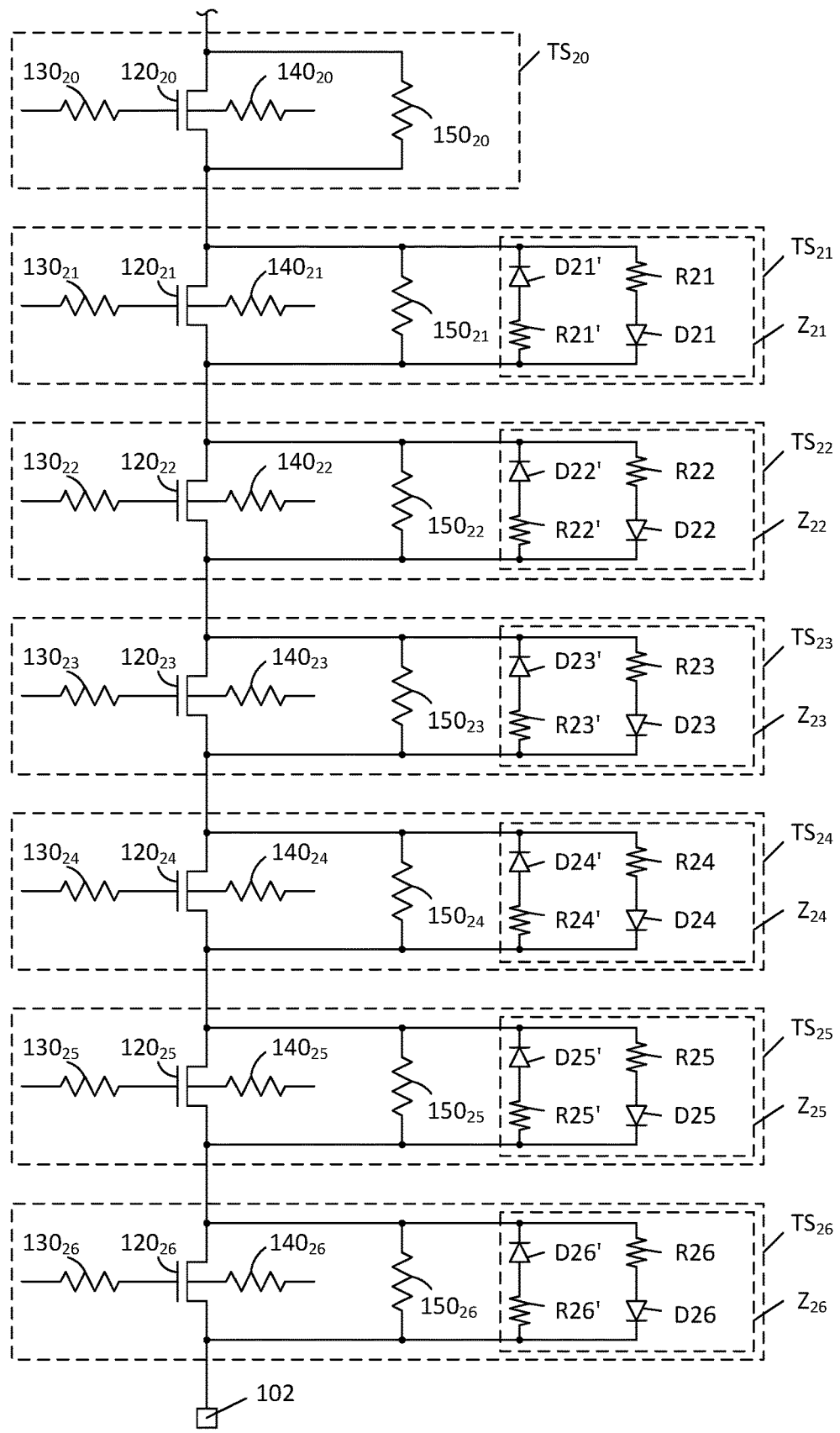

FIGS. 4A and 4B are circuit diagrams illustrating an upper end and a lower end, respectively, of transistor stack 300 in accordance with one embodiment of the present invention. More specifically, FIG. 4A illustrates circuitry included in the uppermost seven transistor switch circuits $TS_1$-$TS_7$ of transistor stack 300, while FIG. 4B illustrates circuitry included in the lowermost seven transistor switch circuits $TS_{20}$-$TS_{26}$ of transistor stack 300. Note that the middle transistor switch circuits $TS_8$-$TS_{19}$ not illustrated by FIGS. 4A and 4B include circuitry identical to the circuitry included in transistor switch circuits $TS_7$ and $TS_{20}$. That is, transistor switch circuits $TS_7$-$TS_{20}$ are identical transistor switch circuits that do not include dynamic impedance circuits (described below).

Figure 1:
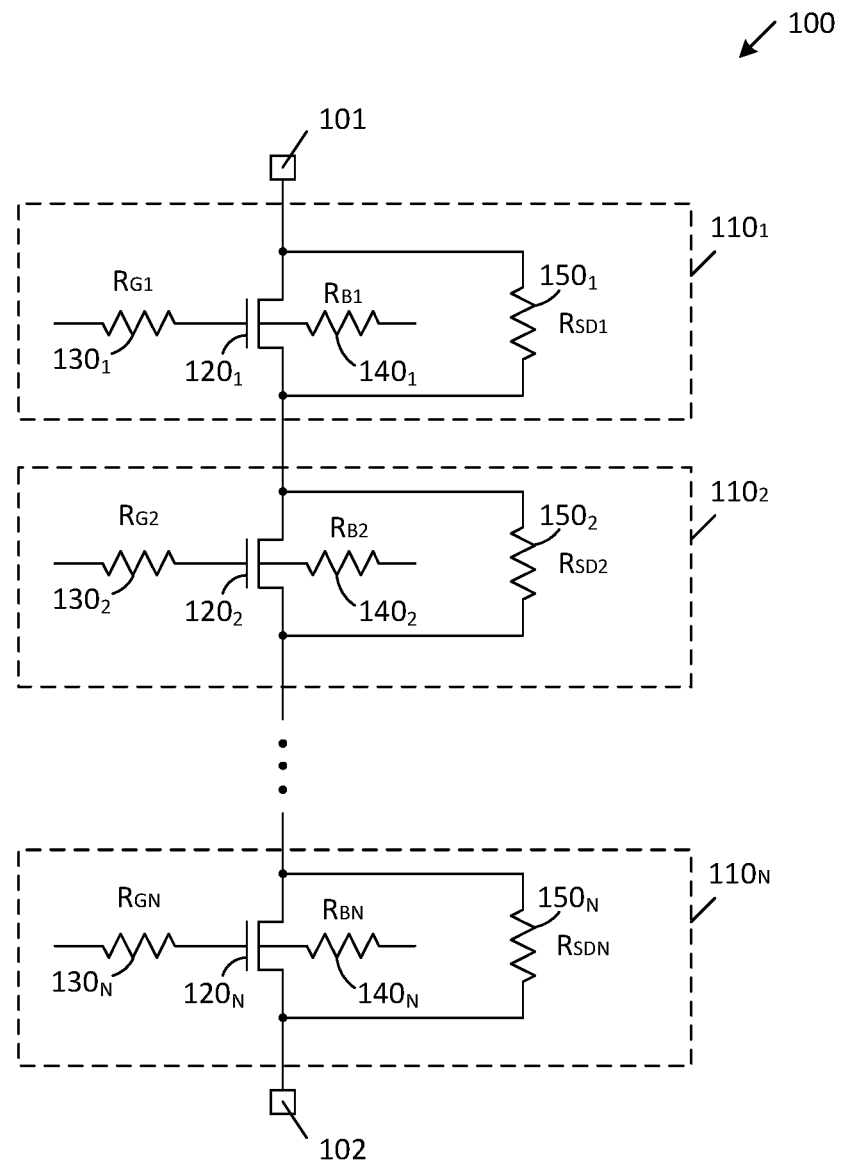
FIG. 1 is a circuit diagram of a conventional uniform stack of a plurality of series-connected transistor circuits, which extend between a first port and a second port to form an RF switch.
Figure 2:
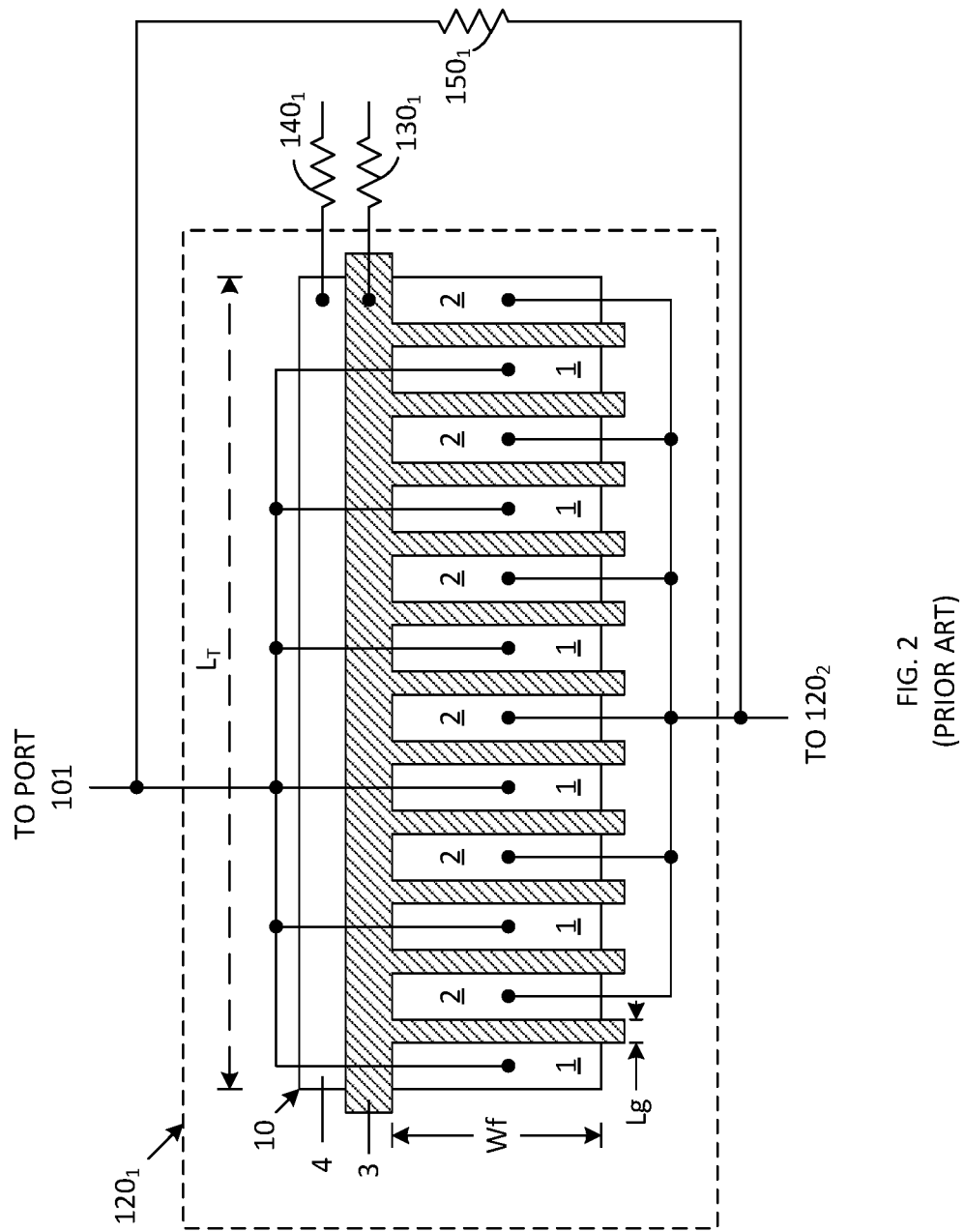
FIG. 2 is a schematic diagram illustrating the general construction of a multi-finger transistor of the conventional uniform stack of FIG. 1.

As shown in FIG. 4A, each of the transistor switch circuits $TS_1$-$TS_{26}$ includes circuit elements similar to those described above in connection with uniform transistor stack 100. Similar circuit elements in FIGS. 1 and 4A-4B are labeled with similar reference numbers. Thus, transistor switch circuits $TS_1$-$TS_{26}$ include identical high-voltage field effect transistors (FETs) $120_1$-$120_{26}$, respectively, identical gate bias resistors $130_1$-$130_{26}$, respectively, identical body/channel bias resistors $140_1$-$140_{26}$, respectively, and identical source/drain resistors $150_1$-$150_{26}$, respectively. In the described examples, switching transistors $120_1$-$120_{26}$ are implemented using thin film SOI CMOS transistors in the manner described above in connection with FIG. 2. In the described examples, gate bias resistors $130_1$-$130_{26}$ and body/channel bias resistors $140_1$-$140_{26}$ may each have a resistance of about 100 kOhms, and source/drain resistors $150_1$-$150_{26}$ may each have a resistance of about 10 kOhms. Other resistances are possible in other embodiments. Gate bias control circuitry (not shown) applies control voltages to the gates of high-voltage FETs $120_1$-$120_{26}$ through gate bias resistors $130_1$-$130_{26}$, respectively. Body bias control circuitry (not shown) applies control voltages to the body regions of high-voltage FETs $120_1$-$120_{26}$ through body bias resistors $140_1$-$140_{26}$, respectively.

In addition to the above-described circuit elements, transistor switch circuits $TS_1$-$TS_6$ include dynamic impedance circuits $Z_1$-$Z_6$, respectively, and transistor switch circuits $TS_{21}$-$TS_{26}$ include dynamic impedance circuits $Z_{21}$-$Z_{26}$, respectively. Dynamic impedance circuits $Z_1$-$Z_6$ include diodes D1-D6, respectively, which are connected in series with resistors R1-R6, respectively. Dynamic impedance circuits $Z_1$-$Z_6$ further include diodes D1'-D6', respectively, which are connected in series with resistors R1'-R6', respectively. Similarly, dynamic impedance circuits $Z_{21}$-$Z_{26}$ include diodes D21-D26, respectively, which are connected in series with resistors R21-R26, respectively. Dynamic impedance circuits $Z_{21}$-$Z_{26}$ further include diodes D21'-D26', respectively, which are connected in series with resistors R21'-R26', respectively. Within each of the transistor switch circuits $TS_1$-$TS_6$ and $TS_{21}$-$TS_{26}$, each of the series-connected diode/resistor pairs is connected in parallel with the corresponding high-voltage transistor. For example, within transistor switch circuit $TS_1$, the series-connected diode/resistor pairs D1/R1 and D1'/R1' are each connected in parallel with high voltage transistor $120_1$. Within each of the transistor switch circuits $TS_1$-$TS_6$ and $TS_{21}$-$TS_{26}$, the corresponding diodes are connected in opposing directions with respect to the high voltage transistor. For example, within transistor switch circuit $TS_1$, the cathode of diode D1 is connected to the drain of transistor $120_1$, while the cathode of diode D1' is connected to the source of transistor $120_1$. In general, diodes D1-D6 and D21-D26 may be forward biased when the voltage on the first port 101 is greater than the voltage on the second port 102, and diodes D1'-D6' and D21'-D26' may be forward biased when the voltage on the second port 102 is higher than the voltage on the first port 101.

The operation of transistor stack 300 as an RF switch will now be described. The present example assumes that the transistors $120_1$-$120_{26}$ are n-channel devices (although transistors $120_1$-$120_{26}$ may be p-channel devices in alternate embodiments). To turn the RF switch to an 'on-state', a high gate bias voltage is applied to the gates of transistors $120_1$-$120_{26}$ (via gate bias resistors $130_1$-$130_{26}$), thereby turning on these transistors. A bias voltage is applied to the channel/body regions of transistors $120_1$-$120_{26}$ (via channel/body bias resistors $140_1$-$140_{26}$). Under these conditions, an RF signal may be transmitted between ports 101 and 102 through turned-on transistors $120_1$-$120_{26}$.

Under low power conditions (i.e., when the RF signal has a relatively low peak voltage), diodes D1-D6, D21-D26, D1'-D6' and D21'-D26' are not forward biased (and therefore do not conduct current). Under these conditions, the on-resistance of the transistor stack 300 is therefore determined by the characteristics of the high voltage transistors $120_1$-$120_{26}$ and the parallel resistors $150_1$-$150_{26}$. Thus, under low power conditions, the transistor stack 300 may exhibit the same on-resistance as the conventional uniform transistor stack 100 (assuming that the transistors used in these stacks are identical).

Under high power conditions (i.e., when the RF signal has a relatively high peak voltage), diodes D1-D6, D21-D26, D1'-D6' and D21'-D26' may become forward biased (and therefore conduct current). More specifically, if an RF signal having a relatively high peak voltage is applied to the first port 101, then diodes D1-D6 and D1'-D6' of dynamic impedance circuits $Z_1$-$Z_6$ may become forward biased. Conversely, if an RF signal having a relatively high peak voltage is applied to the second port 102, then diodes D21-D26 and D21'-D26' of dynamic impedance circuits $Z_{21}$-$Z_{26}$ may become forward biased. The inclusion of dynamic impedance circuits $Z_1$-$Z_6$ and $Z_{21}$-$Z_{26}$ therefore allows high power RF signals to be symmetrically applied to either the first port 101 or the second port 102. However, if RF signals will only be applied to the first port 101, then only dynamic impedance circuits $Z_1$-$Z_6$ are required. Conversely, if RF signals will only be applied to the second port 102, then only dynamic impedance circuits $Z_{21}$-$Z_{26}$ are required.

Assume that a high power condition exists, wherein an RF signal having a power of 48 dBm (and a peak voltage of about 89 Volts) is applied to the first port 101. Under these conditions, the on-resistances of transistor switch circuits $TS_1$-$TS_6$ are determined largely by the characteristics of the high voltage transistors $120_1$-$120_6$, the impedances of the forward biased diodes D1-D6 and D1'-D6', and the impedances of resistors R1-R6 and R1'-R6'. The forward biased diodes D1-D6 and D1'-D6' and the associated resistors R1-R6 and R1'-R6' have combined impedances that are significantly lower than the impedances of the parallel source/drain resistors $150_1$-$150_6$. As a result, the voltage drops across the associated transistors $120_1$-$120_6$ are controlled by the impedances of the forward biased diodes D1-D6 and D1'-D6' and the associated resistors R1-R6 and R1'-R6'. By properly selecting the impedances of the forward biased diodes D1-D6 and D1'-D6' and the associated resistors R1-R6 and R1'-R6', the voltage drops across each of the transistors $120_1$-$120_6$ are controlled to have approximately the same voltage (which is less than the breakdown voltages of these transistors) under high power conditions. This results in a more uniform voltage distribution across all of the transistors $120_1$-$120_{26}$ of the transistor stack 300. Limiting the voltage drops across the transistors $120_1$-$120_6$ closest to the port 101 receiving the high power RF signal prevents voltage breakdown within these transistors, effectively enabling the transistor stack 300 to handle higher power RF signals than a conventional uniform stack 100.

In the manner described above, diodes D1-D6 and D1'-D6' effectively change the resistances (impedances) in parallel with transistors $120_1$-$120_6$ based on the voltage drops across these transistors $120_1$-$120_6$. Resistors R1-R6 and R1'-R6' limit the voltage drops across diodes D1-D6 and D1'-D6' to avoid worsening the linearity of the diodes and the overall switch. Under the above-described high power conditions, the dynamic impedance circuits $Z_1$-$Z_6$ (resistor/diode pairs) will have lower impedances than the corresponding transistors $120_1$-$120_6$, respectively, thereby reducing the overall impedances of the corresponding transistor switch circuits $TS_1$-$TS_6$. As a result, the voltage drops across transistors $120_1$-$120_6$ are reduced, thereby resulting in more uniform voltage drops across these transistors $120_1$-$120_6$.

Note that the diodes D21-D26 and D21'-D26' might not be forward biased under the above-described high power condition. However, if a high power RF signal is applied to the second terminal 102, then these diodes D21-D26 and D21'-D26' will become forward biased, such that these diodes D21-D26 and D21'-D26' (along with the associated resistors R21-R26 and R21'-R26') will control the voltage drops across the corresponding transistors $120_{21}$-$120_{26}$ in the same manner described above.

In accordance with one embodiment, the sizes of the diodes D1-D6, D21-D26, D1'-D6' and D21'-D26' and the resistances of resistors R1-R6, R21-R26, R1'-R6' and R21'-R26' are selected to ensure that the voltage drops across the corresponding transistors $120_1$-$120_6$ and $120_{21}$-$120_{26}$ are relatively the same, and less than the breakdown voltages of these transistors during high power conditions. To accomplish this, the diodes D1-D6, D21-D26, D1'-D6' and D21'-D26' can have different sizes (different impedances) and the resistors R1-R6, R21-R26, R1'-R6' and R21'-R26' can have different resistances.

In accordance with one embodiment, the diodes in the dynamic impedance circuits nearer to the first and second ports 101-102 have lower impedances than the diodes in the dynamic impedance circuits further from the first and second ports 101-102. Similarly, the resistors located in the dynamic impedance circuits nearer to the first and second ports 101-102 have lower resistances than the resistors in the dynamic impedance circuits located further from the first and second ports 101-102.

Thus, in a specific example, each of the resistors R1, R1', R26 and R26' (in dynamic impedance circuits $Z_1$ and $Z_{26}$) has a resistance of 300 Ohms; each of the resistors R2, R2', R25 and R25' (in dynamic impedance circuits $Z_2$ and $Z_{25}$) has a resistance of 550 Ohms; each of the resistors R3, R3', R4, R4', R23, R23', R24 and R24' (in dynamic impedance circuits $Z_3$, $Z_4$, $Z_{23}$ and $Z_{24}$) has a resistance of 900 Ohms; and each of the resistors R5, R5', R6, R6', R21, R21', R22 and R22' (in dynamic impedance circuits $Z_5$, $Z_6$, $Z_{21}$ and $Z_{22}$) has a resistance of 2000 Ohms. Note that other resistances are possible in other embodiments.

Figure 5:
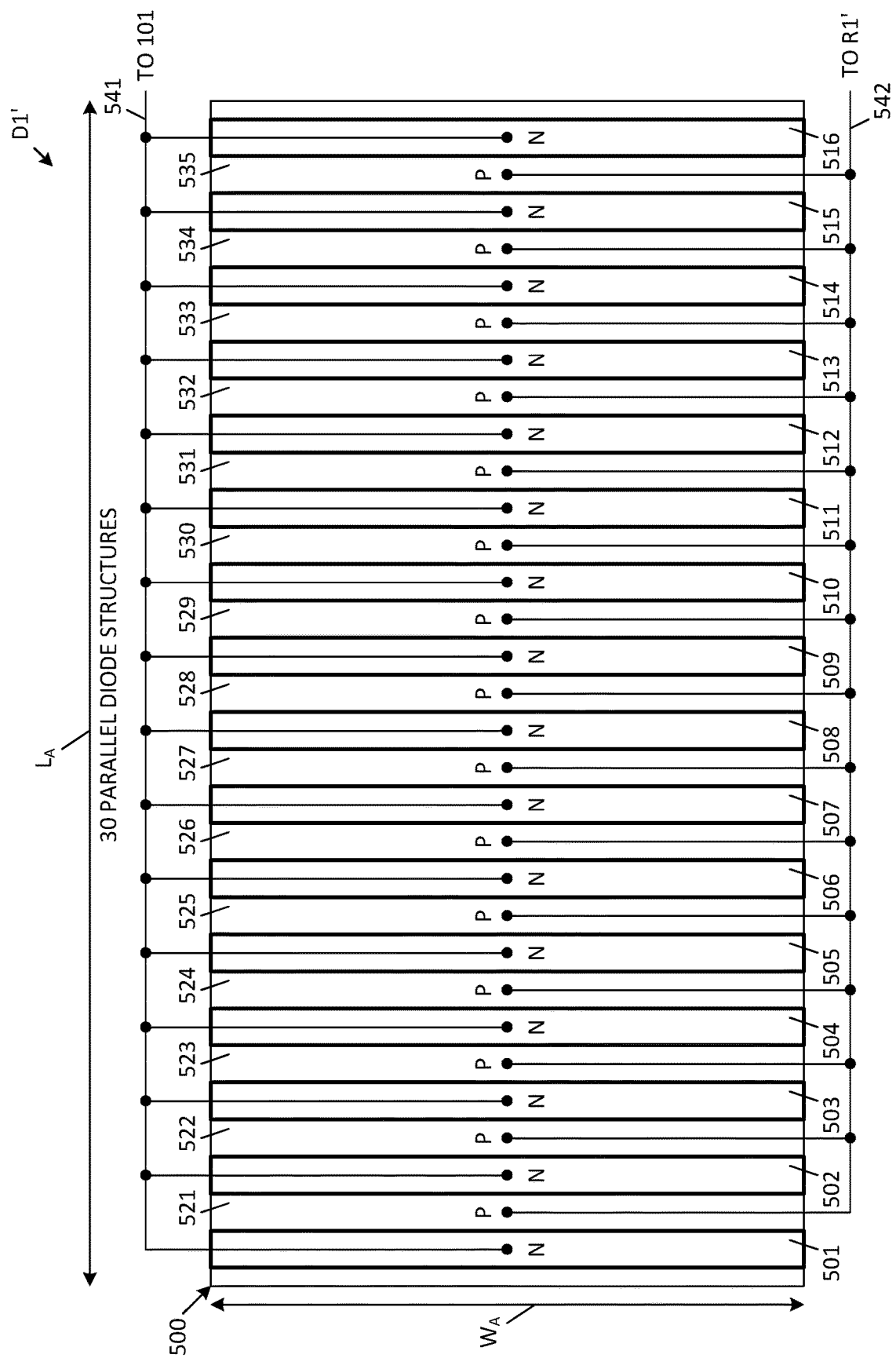
FIG. 5 is a schematic diagram illustrating a generalized layout of a first diode used in a dynamic impedance circuit in accordance with one embodiment of the present invention.

FIG. 5 is a schematic diagram illustrating a generalized layout of diode D1' in accordance with one embodiment. Diode D1' is formed in an active region 500 that includes parallel n-type semiconductor regions 501-516 which are separated by p-type semiconductor regions 521-535. In one embodiment, p-type semiconductor regions 521-535 are continuous under the n-type semiconductor regions 501-516 (i.e., p-type semiconductor regions 521-535 combine to form a p-type well region in which the n-type semiconductor regions 501-516 are formed). In another embodiment, p-type semiconductor regions 521-535 are discrete semiconductor regions.

A metal interconnect structure 541 contacts each of the n-type semiconductor regions 501-516 (and couples these n-type semiconductor regions to the first port 101). Similarly, a metal interconnect structure 542 contacts each of the p-type semiconductor regions 521-535 (and couples these p-type semiconductor regions to resistor R1'). Although a single contact is shown to each of the semiconductor regions 501-516 and 521-535, it is understood that many contacts are typically provided to each of these semiconductor regions.

Active region 500 has a width $W_A$ and a length $L_A$, as illustrated. N-type semiconductor regions 501-516 and p-type semiconductor regions 521-535 form 30 parallel diode structures, each having a p-n junction width of $W_A$, such that the total effective width of the diode D1' is $30 \times W_A$. In a particular example, $W_A$ is 15 microns (e.g., the same as the widths of the polysilicon fingers (Wf) of the corresponding high-voltage transistor structure $120_1$). These dimensions cause the diode D1' to exhibit a first impedance.

In order to create a diode having a higher impedance than diode D1', the number of parallel n-type (and p-type) regions may be reduced. For example, if n-type regions 509-516 and p-type regions 529-535 are eliminated from the structure of FIG. 5, the resulting diode will include 15 parallel diode structures, each having a width of $W_A$, such that the total effective width of the diode is $15 \times W_A$. This modified diode will exhibit a second impedance, which is greater than the impedance of the diode D1'.

Figure 6:
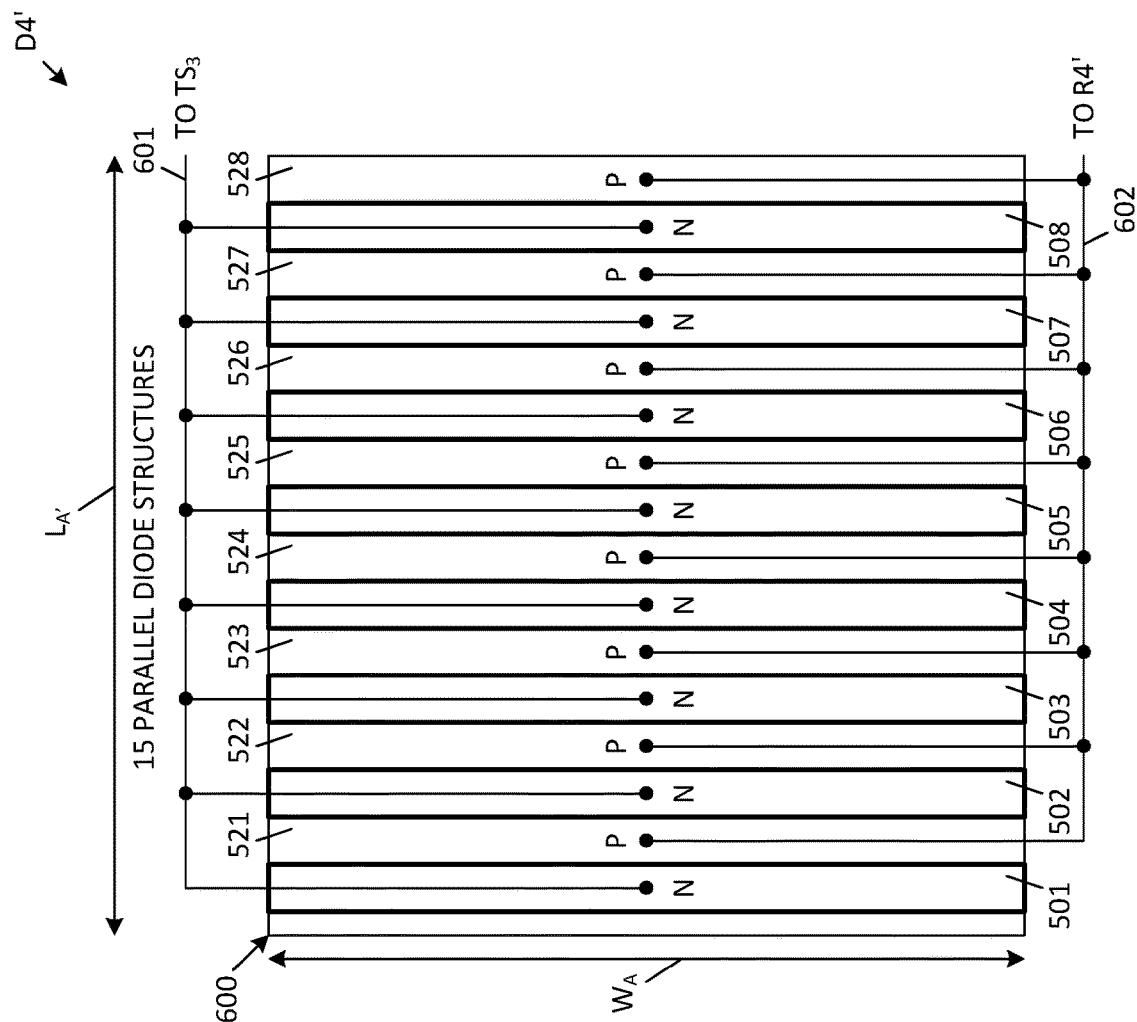
FIG. 6 is a schematic diagram of a generalized layout of a second diode used in a dynamic impedance circuit in accordance with one embodiment of the present invention.

FIG. 6 is a schematic diagram of a generalized layout of diode D4', which includes 15 parallel diode structures, formed in active region 600, in the manner described above. This diode D4' has a length $L_A'$, which is less than the length $L_A$ of diode D1'. Note that metal interconnect structures 601 and 602 provide connections to transistor switch circuit $TS_3$ and resistor R4', respectively.

In accordance with one embodiment, each of diodes D1-D3, D1'-D3', D24-D26 and D24'-D26' in the dynamic impedance circuits $Z_1$-$Z_3$ and $Z_{24}$-$Z_{26}$ has a first layout that includes a first number of parallel diode structures, and each of diodes D4-D6, D4'-D6', D21-D23 and D21'-D23' in the dynamic impedance circuits $Z_4$-$Z_6$ and $Z_{21}$-$Z_{23}$ has a second layout that includes a second number of parallel diode structures, wherein the first number is greater than the second number. In a particular embodiment, each of diodes D1-D3, D1'-D3', D24-D26 and D24'-D26' has a layout similar to that shown in FIG. 5, and each of D4-D6, D4'-D6', D21-D23 and D21'-D23' has a layout similar to that shown in FIG. 6. In other embodiments, each of the diodes can be independently sized to precisely control the voltage drop that occurs across each of the corresponding transistor switch circuits during high power conditions.

In yet other embodiments, harmonic voltages transmitted through the transistors $120_1$-$120_{26}$ of stack 300 can be reduced by controlling the sizes of the diodes in the dynamic impedance circuits $Z_1$-$Z_6$ and $Z_{21}$-$Z_{26}$ (i.e., increasing the sizes of the diodes will reduce the harmonic voltages).

In accordance with one embodiment transistor stack 300 may exhibit a power handling capability about 2 dBm higher than uniform transistor stack 100, while exhibiting very uniform voltage distribution across transistors $120_1$-$120_{26}$.

At an input power of 48 dBm, all of the transistors $120_1$-$120_{26}$ of stack 300 exhibit a source-to-drain voltage less than 4 Volts.

Because the highest voltage drops occur across transistors located near the end of the transistor stack 300 that receives the RF signal, dynamic impedance circuits $Z_1$-$Z_6$ and $Z_{21}$-$Z_{26}$ are only provided near the ends of transistor stack 300. Although the illustrated embodiments show dynamic impedance circuits in the six transistor switch circuits $TS_1$-$TS_6$ and $TS_{21}$-$TS_{26}$ closest to each end of the transistor stack 300, it is understood that in other embodiments, other numbers of dynamic impedance circuits can be used.

Although the transistor stack 300 of the described embodiments includes 26 transistor switch circuits $TS_1$-$TS_{26}$, it is understood that other embodiments may include other numbers of transistor switch circuits. In general, the number of transistor switch circuits should be minimized, while maintaining the required operating parameters of the associated RF switch (e.g., peak voltage).

Figure 7:
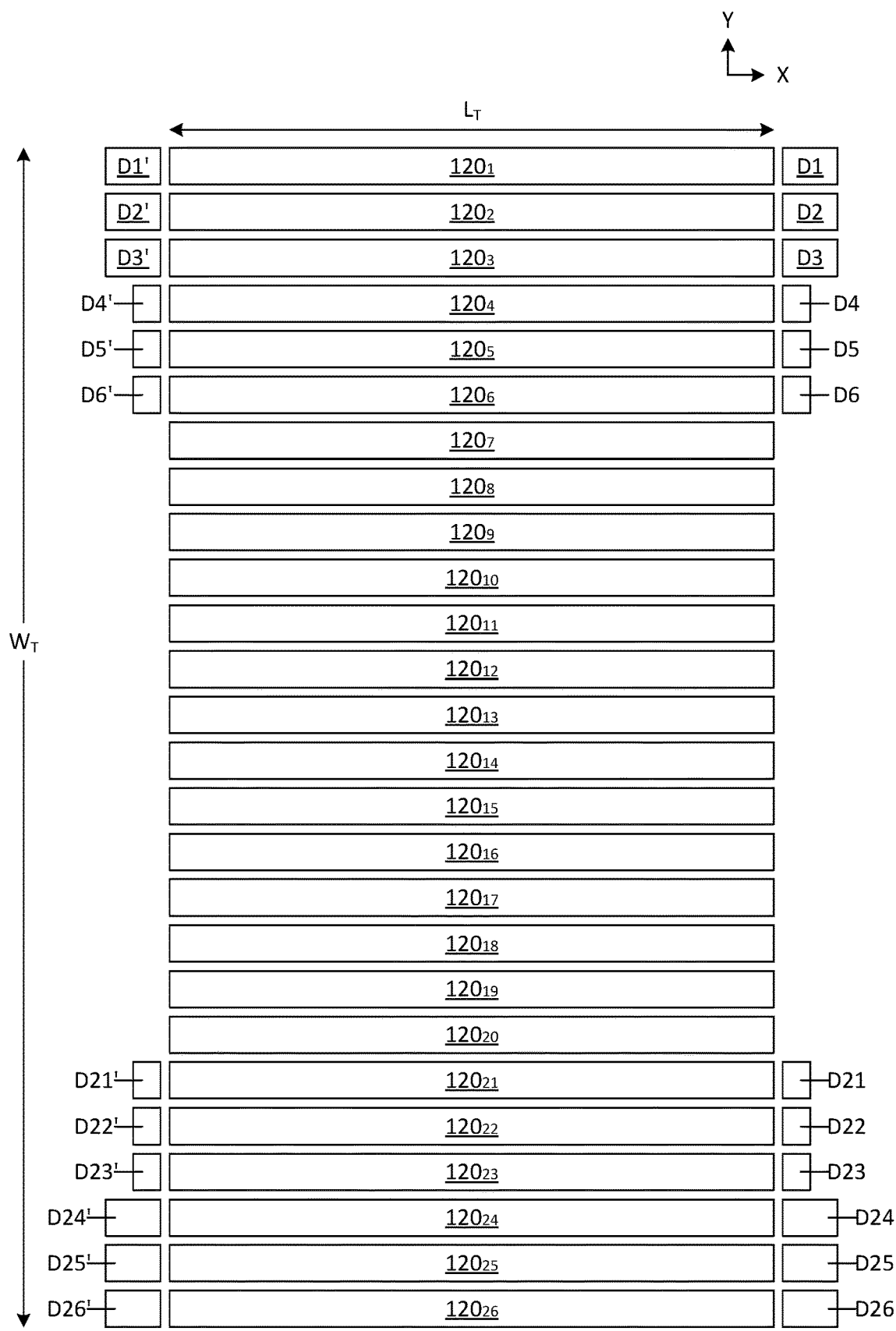
FIG. 7 is a block diagram illustrating the layout of active regions of the transistor stack of FIG. 3 in accordance with one embodiment of the present invention.

FIG. 7 is a block diagram illustrating the layout of active regions of the transistor stack 300 in accordance with one embodiment of the present invention. The active region of each of transistors $120_1$-$120_{26}$ generally corresponds with active region 10 as set forth in FIG. 2. In the illustrated example, each of transistors $120_1$-$120_{26}$ includes 334 parallel gate fingers, each having a width Wf of about 15 microns, such that the total effective gate width of each of the transistors $120_1$-$120_{26}$ is about 5.0 mm (i.e., 15 microns×334 fingers). The total length $L_T$ of each of the transistors $120_1$-$120_{26}$ is about 301 microns. As shown in FIG. 7, the active regions of transistors $120_1$-$120_{26}$ are stacked along a Y-axis to form a rectangular region having a total width Wt of about 537 microns. Thus, the active regions of transistors $120_1$-$120_{26}$ exhibit a combined layout area of about 0.1616 $mm^2$.

The active regions of diodes D1-D6 and D21-D26 are laid out immediately adjacent to the right ends of the active regions of transistors $120_1$-$120_6$ and $120_{21}$-$120_{26}$, respectively. Similarly, the active regions of diodes D1'-D6' and D21'-D26' are laid out immediately adjacent to the left ends of the active regions of transistors $120_1$-$120_6$ and $120_{21}$-$120_{26}$, respectively. Diodes D1-D3, D1'-D3', D24-D26 and D24'-D26' have the same general layout shown in FIG. 5, while diodes D4-D6, D45'-D6', D21-D23 and D21'-D23' have the same general layout shown in FIG. 6. In one embodiment, diodes D1-D6, D1'-D6', D21-D26 and D21'-D26' exhibit a combined layout area of about 0.0121 $mm^2$, such that the total layout area of the active regions of transistor stack 300 is about 0.1737 $mm^2$ (0.1616 $mm^2$ + 0.0121 $mm^2$).

Note that if layout area of the active regions of transistors $120_1$-$120_{26}$ corresponds with the required layout area of conventional uniform stack 100, then the required layout area of the active regions of transistor stack 300 of the present invention represents an area increase of about 7.5 percent. In this example, the addition of dynamic impedance circuits $Z_1$-$Z_6$ and $Z_{21}$-$Z_{26}$ also increases the off-capacitance ($C_{OFF}$) of the transistor stack 300, relative to the off-capacitance of the conventional uniform stack 100, by about 6%. As a result, the transistor stack 300 of the present invention exhibits a larger $R_{ON} \times C_{OFF}$ value than the conventional uniform stack 100. In the present example, conventional uniform stack 100 exhibits a $R_{ON} \times C_{OFF}$ value of about 86.4, and transistor stack 300 exhibits a $R_{ON} \times C_{OFF}$ value of about 91.6.

However, by reducing the voltage drop exhibited across the transistors $120_1$-$120_6$ and $120_{21}$-$120_{26}$ at the ends of the transistor stack 300, the dynamic impedance circuits $Z_1$-$Z_6$ and $Z_{21}$-$Z_{26}$ advantageously increase the power handling ability of transistor stack 300 relative to the uniform transistor stack 100. In the present example, the transistor stack 300 of the present invention is able to handle peak voltages up to 89 Volts, while conventional uniform stack 100 is only able to handle peak voltages up to 70 Volts. That is, while a peak voltage of 89 Volts is applied to the first port 101 (or the second port 102) and transistors $120_1$-$120_{26}$ are in an on-state, the dynamic impedance circuits $Z_1$-$Z_6$ and $Z_{21}$-$Z_{26}$ ensure that the voltages across transistors $120_1$-$120_{26}$ do not exceed their breakdown voltage.

For a better comparison of the conventional uniform stack 100 and the transistor stack 300 of the present invention, the following figure of merit (FOM) is proposed:

$$\text{FOM} = (R_{ON} \times C_{OFF}) \times \text{Area} / \text{ACBV} \quad (1)$$

wherein Area is the layout area of the active regions of the transistor stack and ACBV is the AC breakdown voltage of the transistor stack (i.e., the off-state voltage, which if exceeded, will cause one or more of the transistors in the stack to exceed its breakdown voltage). Thus, a higher layout area will increase the FOM value, while a higher AC breakdown voltage will reduces the FOM value. A lower FOM value is more desirable.

Using equation (1), the uniform transistor stack 100 of the present example exhibits a FOM value of about 0.1975, while the transistor stack 300 of the present invention exhibits a FOM value of about 0.1787, which represents an improvement of about 10 percent.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A semiconductor switch comprising:
   a first port configured to receive a radio frequency (RF) signal;
   a first transistor switch circuit connected to the first port, wherein the first transistor switch circuit includes a first transistor coupled to the first port, a source/drain resistor coupled in parallel with the first transistor, and a first dynamic impedance circuit coupled in parallel with the first transistor, wherein the first dynamic impedance circuit reduces an impedance of the first transistor switch circuit when an RF signal received on the first port is transmitted through the first transistor; and
   a plurality of transistor switch circuits coupled in series between the first transistor switch circuit and a second port.

2. The semiconductor switch of claim 1, further comprising:
   a second transistor switch circuit coupled between the first transistor switch circuit and the plurality of transistor switch circuits, wherein the second transistor switch circuit includes a second transistor coupled in series with the first transistor, and a second dynamic impedance circuit coupled in parallel with the second transistor, wherein the second dynamic impedance circuit reduces an impedance of the second transistor switch circuit when an RF signal received on the first port is transmitted through the second transistor.

3. The semiconductor switch of claim 2, wherein the first dynamic impedance circuit reduces the impedance of the first transistor switch circuit to provide a first peak voltage drop across the first transistor, and the second impedance circuit reduces the impedance of the second transistor switch circuit to provide a second peak voltage drop across the second transistor, wherein the first peak voltage drop is the same as the second peak voltage drop.

4. The semiconductor switch of claim 1, wherein there are no dynamic impedance circuits included in the plurality of transistor switch circuits.

5. The semiconductor switch of claim 1, further comprising:
a second transistor switch circuit coupled between the second port and the plurality of transistor switch circuits, wherein the second transistor switch circuit includes a second transistor coupled in series with the first transistor and the plurality of transistor switch circuits, and a second dynamic impedance circuit coupled in parallel with the second transistor, wherein the second dynamic impedance circuit reduces an impedance of the second transistor switch circuit when an RF signal received on the second port is transmitted through the second transistor.

6. The semiconductor switch of claim 5, further comprising:
a third transistor switch circuit coupled between the second transistor and the plurality of transistor switch circuits, wherein the third transistor switch circuit includes a third transistor coupled in series with the first transistor, the second transistor and the plurality of transistor switch circuits, and a third dynamic impedance circuit coupled in parallel with the third transistor, wherein the third dynamic impedance circuit reduces an impedance of the third transistor switch circuit when an RF signal received on the second port is transmitted through the third transistor.

7. A semiconductor switch comprising:
a first port configured to receive a radio frequency (RF) signal;
a first transistor switch circuit connected to the first port, wherein the first transistor switch circuit includes a first transistor coupled to the first port and a first dynamic impedance circuit coupled in parallel with the first transistor, wherein the first dynamic impedance circuit includes:
a first diode connected in series with a first resistor to form a first diode/resistor pair, wherein the first diode/resistor pair is coupled in parallel with the first transistor; and
a second diode connected in series with a second resistor to form a second diode/resistor pair, wherein the second diode/resistor pair is coupled in parallel with the first transistor;
wherein the first dynamic impedance circuit reduces an impedance of the first transistor switch circuit when an RF signal received on the first port is transmitted through the first transistor; and
a plurality of transistor switch circuits coupled in series between the first transistor switch circuit and a second port.

8. The semiconductor switch of claim 7, wherein the first diode and the second diode are configured in opposite directions.

9. A semiconductor switch comprising:
a first port configured to receive a radio frequency (RF) signal;
a first transistor switch circuit connected to the first port, wherein the first transistor switch circuit includes a first transistor coupled to the first port and a first dynamic impedance circuit coupled in parallel with the first transistor, wherein the first dynamic impedance circuit includes:
a first diode connected in series with a first resistor to form a first diode/resistor pair, wherein the first diode/resistor pair is coupled in parallel with the first transistor; and
a second diode connected in series with a second resistor to form a second diode/resistor pair, wherein the second diode/resistor pair is coupled in parallel with the first transistor;
wherein the first dynamic impedance circuit reduces an impedance of the first transistor switch circuit when an RF signal received on the first port is transmitted through the first transistor;
a plurality of transistor switch circuits coupled in series between the first transistor switch circuit and a second port; and
a second transistor switch circuit coupled between the first transistor switch circuit and the plurality of transistor switch circuits, wherein the second transistor switch circuit includes a second transistor coupled in series with the first transistor, and a second dynamic impedance circuit coupled in parallel with the second transistor, wherein the second dynamic impedance circuit includes:
a third diode connected in series with a third resistor to form a third diode/resistor pair, wherein the third diode/resistor pair is coupled in parallel with the second transistor; and
a fourth diode connected in series with a fourth resistor to form a fourth diode/resistor pair, wherein the fourth diode/resistor pair is coupled in parallel with the second transistor
wherein the second dynamic impedance circuit reduces an impedance of the second transistor switch circuit when an RF signal received on the first port is transmitted through the second transistor.

10. The semiconductor switch of claim 9, wherein the first diode and the second diode each have a first size, and the third diode and the fourth diode each have a second size, different than the first size.

11. The semiconductor switch of claim 10, wherein the first size is larger than the second size.

12. The semiconductor switch of claim 11, wherein the first resistance is less than the second resistance.

13. The semiconductor switch of claim 9, wherein the first resistor and the second resistor each have a first resistance, and the third resistor and the fourth resistor each have a second resistance, different than the first resistance.

14. A semiconductor switch comprising:
a first port configured to receive a radio frequency (RF) signal;
a first transistor switch circuit connected to the first port, wherein the first transistor switch circuit includes a first transistor coupled to the first port and a first dynamic impedance circuit coupled in parallel with the first transistor, wherein the first transistor comprises:
a gate electrode having a plurality of gate fingers that extend in parallel over an active region, wherein a channel region having a first conductivity type is located under each of the plurality of gate fingers;
a plurality of source regions having a second conductivity type, opposite the first conductivity type, formed in the active region, wherein each of the plurality of source regions abuts the channel region;

a plurality of drain regions having the second conductivity type formed in the active region, wherein each of the plurality of drain regions abuts the channel region, and wherein the drain regions are interleaved with the source regions;

a first interconnect structure that commonly connects each of the plurality of source regions; and a second interconnect structure that commonly connects each of the plurality of drain regions;

wherein the first dynamic impedance circuit reduces an impedance of the first transistor switch circuit when an RF signal received on the first port is transmitted through the first transistor; and a plurality of transistor switch circuits coupled in series between the first transistor switch circuit and a second port.

15. The semiconductor switch of claim 14, wherein the first transistor switch circuit comprises:

a first resistor connected to the gate electrode;

a second resistor connected to the channel region; and a third resistor connected across the first and second interconnect structures.

16. A method of operating a radio frequency (RF) switch comprising:

transmitting an RF signal between a first port and a second port through a plurality of series-connected transistor switch circuits, including a first plurality of transistor switch circuits located immediately adjacent to the first port, and a second plurality of transistor switch circuits located between the second port and the first plurality of transistor switch circuits; and dynamically adjusting impedances of the first plurality of transistor switch circuits by forward biasing diodes within the first plurality of transistor switch circuits when transmitting the RF signal from the first port to the second port, wherein dynamically adjusting the impedances of the first plurality of transistor switch circuits equalizes peak voltage drops across the first plurality of transistor switch circuits.

17. A method of operating a radio frequency (RF) switch comprising:

transmitting an RF signal between a first port and a second port through a plurality of series-connected transistor switch circuits, including a first plurality of transistor switch circuits located immediately adjacent to the first port, a second plurality of transistor switch circuits located between the second port and the first plurality of transistor switch circuits, and a third plurality of transistor switch circuits located immediately adjacent to the second port;

dynamically adjusting impedances of the first plurality of transistor switch circuits when transmitting the RF signal from the first port to the second port, wherein dynamically adjusting the impedances of the first plurality of transistor switch circuits equalizes peak voltage drops across the first plurality of transistor switch circuits; and dynamically adjusting impedances of the third plurality of transistor switch circuits when transmitting the RF signal from the second port to the first port, wherein dynamically adjusting the impedances of the third plurality of transistor switch circuits equalizes peak voltage drops across the third plurality of transistor switch circuits.

18. A semiconductor switch comprising:

a first port configured to receive a radio frequency (RF) signal;

a first plurality of transistor switch circuits connected in series with the first port, wherein each of the first plurality of transistor switch circuits includes a first transistor, a first source/drain resistor coupled in parallel with the first transistor, and a first dynamic impedance circuit coupled in parallel with the first transistor, wherein within each of the first plurality of transistor switch circuits, the first dynamic impedance circuit reduces an effective impedance of the first transistor when an RF signal received on the first port is transmitted through the first transistor; and a second plurality of transistor switch circuits connected in series between the first plurality of transistor switch circuits and a second port, wherein each of the second plurality of transistor switch circuits includes a second transistor and a second source/drain resistor coupled in parallel with the second transistor, and wherein each second transistor is connected in series with each first transistor.

19. A semiconductor switch comprising:

a first port configured to receive a radio frequency (RF) signal;

a first plurality of transistor switch circuits connected in series with the first port, wherein each of the first plurality of transistor switch circuits includes a first transistor and a first dynamic impedance circuit coupled in parallel with the first transistor, wherein within each of the first plurality of transistor switch circuits, the first dynamic impedance circuit reduces an effective impedance of the first transistor when an RF signal received on the first port is transmitted through the first transistor;

a second plurality of transistor switch circuits connected in series between the first plurality of transistor switch circuits and a second port, wherein each of the second plurality of transistor switch circuits includes a second transistor, and wherein each second transistor is connected in series with each first transistor; and a third plurality of transistor switch circuits connected in series between the second plurality of transistor switch circuits and the second port, wherein each of the third plurality of transistor switch circuits includes a third transistor and a third dynamic impedance circuit coupled in parallel with the third transistor, wherein within each of the third plurality of transistor switch circuits, the third dynamic impedance circuit reduces an effective impedance of the third transistor when an RF signal received on the second port is transmitted through the third transistor.

* * * * *